US010784698B2

(12) United States Patent
Jaensch et al.

(10) Patent No.: US 10,784,698 B2
(45) Date of Patent: Sep. 22, 2020

(54) MODULATION INDEX IMPROVEMENT BY INTELLIGENT BATTERY

(71) Applicant: Dr. Ing. h.c. F. Porsche Aktiengesellschaft, Stuttgart (DE)

(72) Inventors: Malte Jaensch, Bietigheim-Bissingen (DE); Jan Kacetl, Gemmrigheim (DE); Tomas Kacetl, Gemmrigheim (DE); Stefan Götz, Forstern (DE)

(73) Assignee: Dr. Ing. h.c.F. Porsche Aktiengesellschaft (DE)

( * ) Notice: Subject to any disclaimer, the term of this patent is extended or adjusted under 35 U.S.C. 154(b) by 0 days.

(21) Appl. No.: 16/299,771

(22) Filed: Mar. 12, 2019

(65) Prior Publication Data

US 2019/0288535 A1   Sep. 19, 2019

(30) Foreign Application Priority Data

Mar. 19, 2018   (DE) .................. 10 2018 106 308

(51) Int. Cl.
| | |
|---|---|
| *H02J 7/00* | (2006.01) |
| *G01R 31/382* | (2019.01) |
| *H02P 5/74* | (2006.01) |
| *H02P 27/14* | (2006.01) |

(52) U.S. Cl.
CPC .......... *H02J 7/0063* (2013.01); *G01R 31/382* (2019.01); *H02P 5/74* (2013.01); *H02P 27/14* (2013.01); *H02J 2007/0067* (2013.01)

(58) Field of Classification Search
CPC ......... H02J 7/0063; G01R 31/382; H02P 5/74
See application file for complete search history.

(56) References Cited

U.S. PATENT DOCUMENTS

| 4,467,407 A | * | 8/1984 | Asano | .................. H02M 7/487 363/43 |
| 6,580,977 B2 | * | 6/2003 | Ding | ..................... B60L 58/34 701/22 |
| 2008/0054870 A1 | | 3/2008 | Kosaka et al. | |

(Continued)

FOREIGN PATENT DOCUMENTS

| DE | 102010052934 A1 | 5/2012 |
| DE | 102012202863 A1 | 8/2013 |

(Continued)

*Primary Examiner* — Cortez M Cook
(74) *Attorney, Agent, or Firm* — RatnerPrestia

(57) ABSTRACT

A method for improving the modulation index using an intelligent battery pack, in which method a battery pack includes a plurality of freely interconnectable energy modules. An energy module has at least one energy cell and at least two switches, and in which method series or parallel interconnection of a respective energy module with at least one adjacent energy module of the battery pack is implemented by a controller. A terminal voltage of the battery pack, which terminal voltage results from the respective interconnection, is adjusted in accordance with a respectively prespecified load demand on at least one N-phase electrical machine. The terminal voltage is connected as an input voltage to at least one multi-stage inverter, and an N-phase alternating current for supplying a respective N-phase electrical machine is formed by the at least one multi-stage inverter on the basis of a level of the input voltage.

9 Claims, 3 Drawing Sheets

(56) References Cited

U.S. PATENT DOCUMENTS

| | | | |
|---|---|---|---|
| 2013/0099747 A1* | 4/2013 | Baba | H02J 7/0014 |
| | | | 320/118 |
| 2013/0162217 A1* | 6/2013 | Gaul | H02J 7/00 |
| | | | 320/134 |
| 2014/0217935 A1* | 8/2014 | Matsui | H02P 27/06 |
| | | | 318/139 |
| 2017/0093320 A1 | 3/2017 | Usuda et al. | |
| 2018/0219478 A1 | 8/2018 | Götz | |

FOREIGN PATENT DOCUMENTS

| | | |
|---|---|---|
| DE | 102014223227 A1 | 5/2015 |
| DE | 102015112512 A1 | 2/2017 |
| EP | 2879266 A1 | 6/2015 |

* cited by examiner

MODULATION INDEX IMPROVEMENT BY INTELLIGENT BATTERY

CROSS-REFERENCE TO RELATED APPLICATION

This application claims priority to German Patent Application No. DE 10 2018 106 3083, filed Mar. 19, 2018, which is incorporated by reference herein in its entirety.

FIELD OF THE INVENTION

The present invention relates to a method and to a system for improving the modulation index using an intelligent battery pack, in which method and system the battery pack comprises a large number of energy modules which can be reconfigured in respect of their interconnection.

BACKGROUND OF THE INVENTION

In an electric vehicle, a conventional drive train comprises a battery pack which provides a DC voltage, a two-stage inverter which converts the DC voltage into an AC voltage, and an electric motor which is operated by the AC voltage. A battery pack comprising standard modules provides a fixed terminal voltage which changes only by means of a state of charge, for example drops as a discharge increases. The inverter usually converts the DC voltage into a three-phase AC voltage with which the likewise three-phase electric motor is operated. In this case, a level of an output voltage of the two-stage inverter is defined by switching back and forth between the input voltage at the level of the terminal voltage of the battery pack and a voltage value of zero.

A quality of the output voltage of the inverter is described by the so-called modulation index which constitutes a measure of a range of a modulation. In this case, the modulation index is defined by a fraction comprising a change in switching frequency in the numerator and a maximum occurring switching frequency in the denominator. In general, it holds true that the higher the modulation index, the less electromagnetic interference, abbreviated to EMI by a person skilled in the art, or total harmonic distortion, abbreviated to THD by a person skilled in the art, occurs. In addition to EMI limit values which have to be complied with, a reduction in electromagnetic interference is preferable in respect of other on-board electronics which are present in the electric vehicle.

The output voltage of the inverter is modulated to a required average value. Since the inverter is fixed at an input voltage which is determined by the battery pack which is fitted with standard modules, there is a low modulation index and therefore a high EMI loading in the case of an only low power requirement of the electric motor, for example when driving slowly or traveling on a slope, this resulting in a reduced output voltage of the inverter.

Document US 2017/0093320 A1, which is incorporated by reference herein, discloses an electric vehicle comprising a battery pack which is reconfigured in order to achieve a desired DC voltage in accordance with a voltage requirement. This is achieved by changing the number of energy cells of the battery pack which are interconnected in parallel.

European patent EP 2 879 266 A1, which is incorporated by reference herein, relates to a number of energy cells which are connected in series and are reconfigured in order to achieve a desired DC voltage in accordance with the voltage requirement of a load apparatus. In this case, the individual energy cells are monitored in respect of their state and interconnected in accordance with this state.

Document US 2008/0054870 A1, which is incorporated by reference herein, discusses an electric vehicle comprising a large number of power storage apparatuses which can be switched over between series and parallel connection, wherein voltages are set in respect of the maximum drive voltage of the electric motor.

SUMMARY OF THE INVENTION

Against this background, described herein is a method with lower EMI loading in comparison to the prior art. In the process, the battery pack with the comprised energy cells should be freely configurable in order to avoid limits in respect of interconnection. Also described herein is a corresponding system for carrying out a method of this kind.

More particularly, described herein is a method for improving the modulation index using an intelligent battery pack, in which method a battery pack comprises a plurality of freely interconnectable energy modules and an energy module has at least one energy cell and at least two switches, and in which method series or parallel interconnection of a respective energy module with at least one adjacent energy module of the battery pack is implemented by a controller, wherein a terminal voltage of the battery pack, which terminal voltage results from the respective interconnection, is adjusted in accordance with a respectively prespecified load demand on at least one N-phase electrical machine, and wherein the terminal voltage is connected as an input voltage to at least one at least two-stage inverter, and an N-phase alternating current for supplying a respective N-phase electrical machine is formed by the at least one at least two-stage inverter on the basis of a level of said input voltage.

The at least two-stage inverter may be a two-level inverter with two output stages or a multi-level inverter with more than two output stages. Here, a so-called neutral-point clamped inverter with a low number of stages, for example three or five stages, can be cited as an example of a multi-level inverter which is relevant for use in electric vehicles. Furthermore, a so-called flying capacitor inverter and a modular multi-level inverter, in this case only with capacitors and very few stages, can be mentioned here.

For the purpose of providing an AC voltage with a specific voltage value which meets the load demand, the at least two-stage inverter has to be switched back and forth between the voltage levels available to it—in the case of exactly two stages corresponding to the two electrical potentials of the input voltage—all the more frequently the greater the difference between the voltage value of the input voltage and of the output voltage. The method according to aspects of the invention advantageously adjusts the input voltage by reconfiguring the interconnection of energy modules in the battery pack and the resulting terminal voltage in such a way that said terminal voltage corresponds as far as possible to the voltage level of the AC voltage which corresponds to the load demand, and thereby leads to an improved modulation index. EMI and THD are correspondingly reduced.

A conventional battery pack can be replaced in a simple manner by an intelligent battery pack which executes the method according to aspects of the invention. In this case, the intelligent battery pack does not use lined-up rows of permanently wired energy cells but rather employs circuit breakers which suitably interconnect the energy modules which comprise energy cells. The intelligent battery pack can implement any desired terminal voltage value up to a maximum terminal voltage, which is reached when all of the available energy modules are connected in series, by suitable series and parallel interconnection. In this way, a voltage drop owing to a failing state of charge or SoC, as it is called by a person skilled in the art, can be equalized, or else a respective inverter can be supplied with a briefly increased input voltage in order to achieve a higher power of the respective N-phase electrical machine for a short time.

In one embodiment of the method according to aspects of the invention, the at least one at least two-stage inverter is selected as a two-stage inverter. The two-stage inverter is also called a two-level inverter.

In one embodiment of the method according to aspects of the invention, a respective interconnection of the battery pack is formed by a battery controller which is comprised by the controller. In this case, the battery controller implements that next-largest terminal voltage, which comes closest to a voltage requested by the controller, by respective series or possibly parallel interconnection of a respective energy module with an adjacent energy module.

In a further embodiment of the method according to aspects of the invention, a respective load demand on the respective N-phase electrical machine is formed by at least one motor controller comprised by the controller. The respective motor controller controls the inverter which is associated with it in order to meet the load demand for the respective N-phase electrical machine. The respective motor controller advantageously directly influences the terminal voltage of the battery pack in order to increase the modulation index in accordance with the invention. This is achieved by direct transmission of a desired, optimum terminal voltage value to the battery controller. Furthermore, the respective motor controller influences a torque of the N-phase electrical machine which is associated with it by way of controlling the output voltage of the respective inverter on the basis of the output voltage of the battery pack, which output voltage is provided by continued measurement, phase currents flowing from the respective inverter to the associated N-phase electrical machine, and a rotor position in the associated N-phase electrical machine. In the case of electrical machines such as, for example, an asynchronous machine and a synchronous machine, including a separately excited synchronous machine or else a permanent-magnet synchronous machine, abbreviated to PSM by a person skilled in the art, for example, wherein both represent an AC machine, the output voltage which is provided by the respective inverter primarily influences the rotational speed. This means that a voltage amplitude which is required for meeting the load demand increases with a realized rotational speed and consequently a higher output voltage is generally requested at a high rotational speed. However, saturation or so-called field weakening can occur first, that is to say a voltage which acts on the electrical machine does not increase further and a current flowing in the electrical machine is phase-offset such that it reduces its own field, for example the torque-generating field of the permanent magnets or the excitation field. Secondly, the terminal voltage is reduced in the case of a high load current on account of an internal resistance of the battery pack, wherein, in particular, a high torque causes the high load current. For a contemporary electrical drive, which is almost exclusively torque-controlled, possible control of the load demand is therefore conceivable as follows: starting from an actual rotational speed which is provided by the electrical machine, the controller generates a torque requirement which, together with the actual rotational speed, gives specific current and voltage amplitude requirements. A peak value of the voltage amplitude requirement or a value which lies above this is then passed to the configurable battery pack. Optionally, this value can also be increased depending on the phase currents flowing to the electrical machine or lowered in accordance with a current flowing in the battery. In the process, the internal resistance of the battery pack can be taken into account using calculations in accordance with Ohm's law. Although said internal resistance changes depending on the series or parallel interconnection of the battery pack, it can be calculated from the internal resistances of the individual energy modules in the case of a known configuration. For example, a controller can optionally estimate the internal resistances by continued measurement of an existing output current and the output voltage of the battery pack for each energy module in the case of known configurations, or can estimate the internal resistance of the battery pack without known configurations.

In a yet further embodiment of the method according to aspects of the invention, state values of the battery pack are monitored by a vehicle high-voltage control means. The vehicle high-voltage control means controls the battery pack by switching on or switching off the output voltage of the battery pack. A torque requirement can also be made of the respective motor controller of an N-phase electrical machine by the vehicle high-voltage control means.

In a continued further embodiment of the method according to aspects of the invention, a temperature and/or a state of charge and/or an on/off state are/is selected as state values of the battery pack. The battery pack reports these state values to the vehicle high-voltage control device which controls the output voltage of the battery pack to the inverter, that is to say substantially terminal voltage on/off, and transmits a torque requirement to a motor control device.

In a further embodiment of the method according to aspects of the invention, the load demand on the respective N-phase electrical machine, which load demand is formed by the at least one motor controller, is transmitted to the battery controller, Depending on the load demand which is transmitted to the battery controller and is requested by the at least one motor controller of a respective N-phase electrical machine and has a proportional, but not necessarily strictly linear, relationship with the terminal voltage which is provided by the battery pack, the series or parallel interconnection of the energy modules is reconfigured by the battery controller in such a way that the resulting terminal voltage is greater than but as close as possible to a required voltage value, in order to finally provide the requested load demand at the at least one N-phase electrical machine after conversion into an N-phase AC voltage by the at least one inverter.

In a further embodiment of the method according to aspects of the invention, a single load demand is ascertained from the load demands on the respective N-phase electrical machines, which load demands are formed by at least two motor controllers, and is transmitted to the battery controller as voltage value requirement. For example, a maximum load demand is ascertained from amongst the load demands. By providing that terminal voltage which causes the maximum load demand to be met, it is ensured that, even at that N-phase electrical machine for which said maximum load demand is originally made, the output voltage required for this purpose can be generated by the inverter which is associated with it.

In a yet further embodiment of the method according to aspects of the invention, a terminal voltage value, which is implemented by means of the interconnection of the energy modules, is transmitted to the at least one motor controller by the battery controller. The respective motor controller therefore has knowledge of the input voltage which is available to a respective inverter.

The invention further claims a system for improving the modulation index using an intelligent battery pack, which system comprises a battery pack which has a plurality of energy modules which can each be interconnected in series or in parallel with respective adjacent energy modules, wherein each energy module has at least one energy cell and at least two switches, and the system further comprises at least one at least two-stage inverter, at least one N-phase electrical machine, at least one control unit which is equipped with a computer processor and a computer program which runs on the computer processor, which control unit is designed to control a terminal voltage of the battery pack, which terminal voltage results from an interconnection of the energy modules, in accordance with a prespecified load demand on the respective N-phase electrical machine, wherein the system is designed to execute a method according to one of the preceding embodiments.

In one refinement of the system according to aspects of the invention, the control unit comprises a battery control unit and at least one motor control unit. The battery control unit can be arranged locally on the battery pack, and the at least one motor control unit can be arranged on a respective inverter.

In a further refinement of the system according to aspects of the invention, the system additionally comprises a maximum value control unit, wherein the maximum value control unit is designed to determine a maximum load demand from at least two load demands which are formed by a respective motor control unit and to transmit said maximum load demand to the battery controller. In the same way, the maximum value control unit can ascertain a maximum voltage requirement from amongst a plurality of voltage requirements.

In a yet further refinement of the system according to aspects of the invention, the system additionally comprises a vehicle high-voltage control device which is designed to record a temperature and/or a state of charge and/or an on/off state of a battery pack.

In a further refinement of the system according to aspects of the invention, the battery pack comprises a plurality of energy modules, wherein the energy module comprises at least two circuit breakers and at least one energy cell which is electrically connected to the at least two circuit breakers. These energy modules can be, for example, energy modules following the principle of multi-level converter technology as has been disclosed, for example, in document DE 10 2010 052 934 A1, which is incorporated by reference herein.

BRIEF DESCRIPTION OF THE DRAWING

Further advantages and refinements of the invention can be found in the description and the appended drawing.

It is understood that the features mentioned above and those still to be explained below can be used not only in the respectively indicated combination but also in other combinations or on their own, without departing from the scope of the present invention.

DETAILED DESCRIPTION OF THE INVENTION

Figure 1:
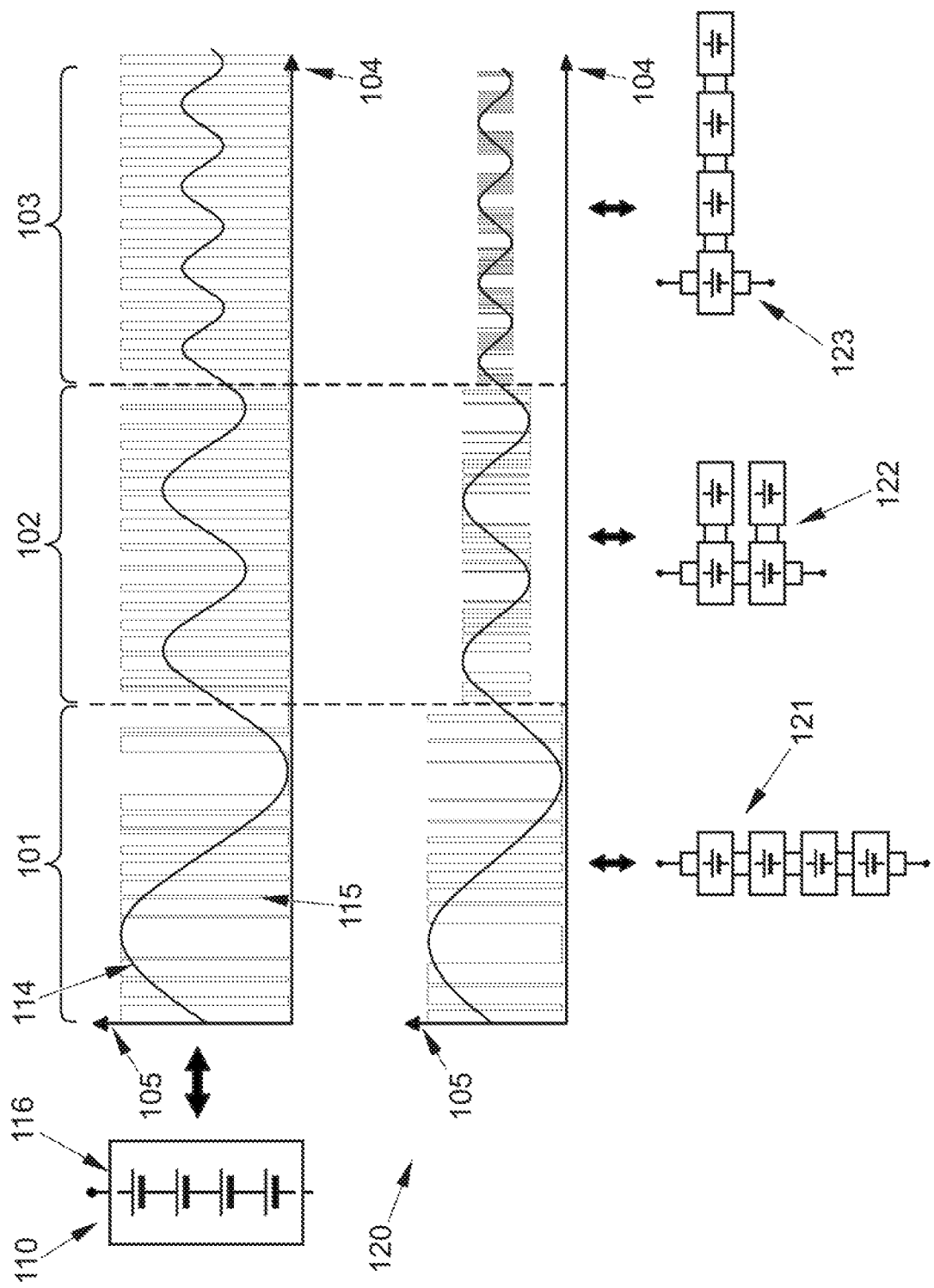
FIG. 1 shows a schematic illustration of an inverter signal based on a battery pack which is interconnected according to the prior art and in the case of one embodiment of the method according to aspects of the invention.

FIG. 1 shows a schematic illustration of an inverter signal based on a battery pack which is interconnected according to the prior art, illustrated in the upper part 110, and in the case of an embodiment of the method according to aspects of the invention, illustrated in the lower part 120. A conventional battery pack 116 with a fixed terminal voltage provides a fixed voltage level to a two-stage inverter. The inverter signal is plotted on a time axis 104 and with a voltage amplitude 105 in the top-right part of FIG. 1. For three time periods 101, 102 and 103, an output signal 115 of the inverter is in each case illustrated for a load demand on an electric motor, which load demand falls time period by time period. In the case of the two-stage inverter, said output signal is made up of voltage signals of different lengths and an amplitude level which is given by switched-on or switched-off input voltage. Said output signal corresponds in the electric motor, on account of its slow rotor mass, to an ultimately sinusoidal AC voltage profile 114. In order to also obtain an AC voltage profile of lower amplitude level, which AC voltage profile results from a switching response of the inverter, in the case of a decreasing load demand, the inverter has to switch at a higher frequency in the case of a fixed voltage level of the input voltage, this reducing a modulation index and having an adverse effect on EMI and/or THD values. In the case of an embodiment of the method according to aspects of the invention, illustrated in the lower part 120 of FIG. 1, a respective series or parallel interconnection of an energy module with at least one neighbor is changed in an intelligent battery pack 121, 122, 123 in such a way that the resulting terminal voltage of the intelligent battery pack results in a voltage level at the input of the inverter, which voltage level corresponds to the respective load demand on the electric motor. The schematic depictions of the intelligent battery pack 121, 122, 123 show that a number of parallel interconnections increases and, in the same way, a number of series interconnections decreases as the voltage level decreases. In the cases shown, the voltage level in each case halves from time period 101 to time period 102 to time period 103, this being achieved in the terminal voltage by reconfiguration of the energy modules of the intelligent battery pack 121 from four energy modules which are connected in series to two energy modules which are connected in series and are each interconnected in parallel with a respective energy module in the case of the intelligent battery pack 122, and finally further reconfiguration to time period 103 with four energy modules which are interconnected in parallel in the intelligent battery pack 123. Owing to the voltage level of the input voltage to the inverter, which voltage level is also low in the case of a low load demand, said inverter does not have to increase the switching frequency in order to implement an AC voltage profile of lower voltage amplitude in the electric motor, as a result of which a higher modulation index is achieved than in the upper part 110 with the conventional battery pack 116.

Figure 2:
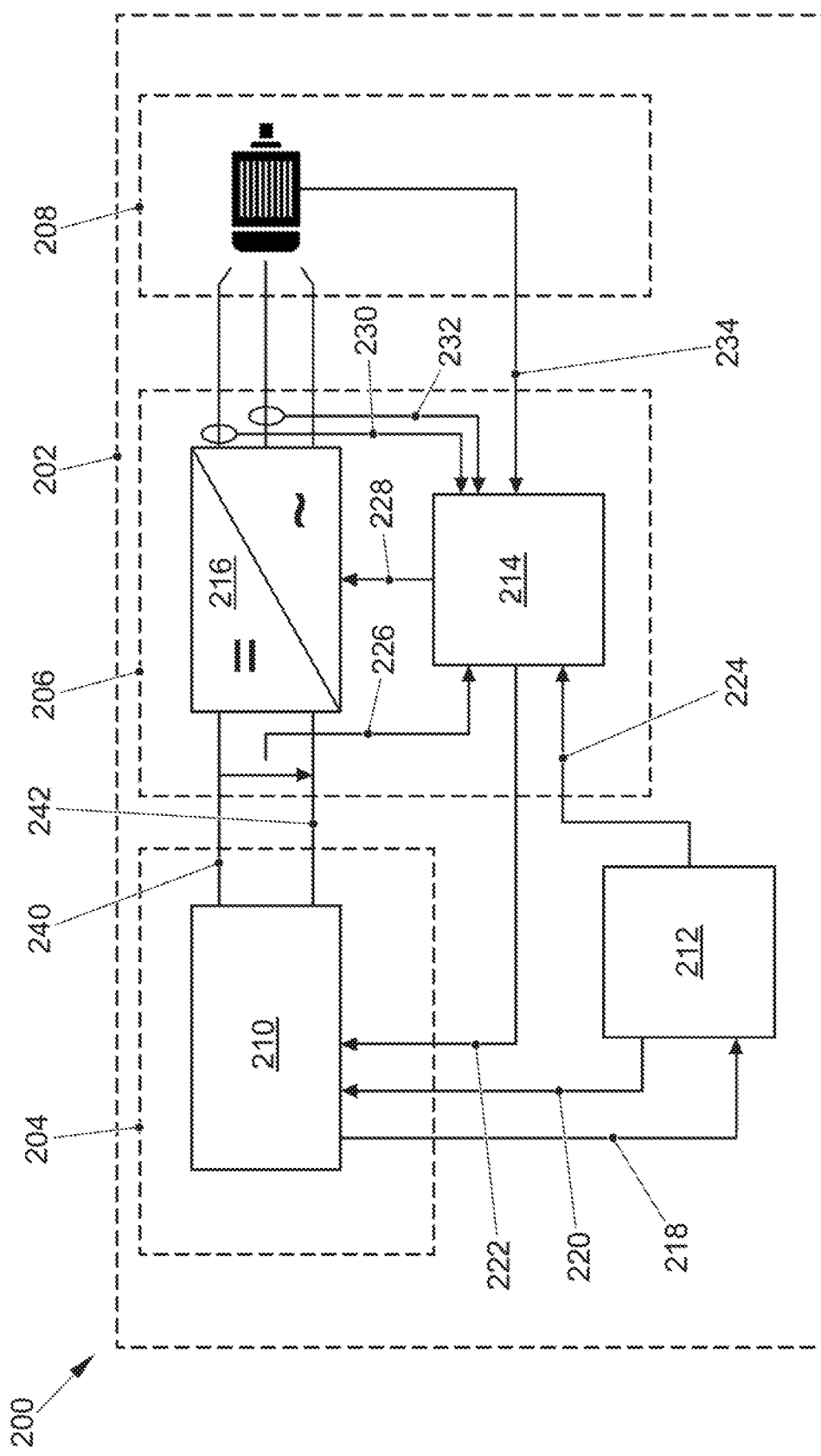
FIG. 2 shows a schematic illustration of one embodiment of the method according to aspects of the invention for a drive train in the case of an N-phase electrical machine.

FIG. 2 shows a schematic illustration 200 of an embodiment of the method according to aspects of the invention for a drive train 202 comprising DC voltage supply 204, AC voltage supply 206 and three-phase electrical machine 208, The intelligent battery pack 210 provides a terminal voltage 240, 242 with the voltage value 226 to an input of the inverter 216. The vehicle high-voltage control means 212 switches the intelligent battery pack 210 to an on or off state 220 and also has knowledge 218 of the state of charge and the temperature of the intelligent battery pack 210. In addition, the vehicle high-voltage control means 212 reports a torque requirement 224 to a motor controller 214. The motor controller 214 controls a torque of the three-phase electrical machine 208 by controlling 228 the output voltage of the inverter 216 based on the voltage value 226 which is provided by the intelligent battery pack. The three-phase inverter 216 shown here supplies a three-phase current to the three-phase electrical machine 208, the measurement values 230, 232 of two of the three phases of said three-phase current being reported to the motor controller 214. Similarly, a rotor position 234 of the three-phase electrical machine 208 is passed on to the motor controller. Depending on the torque requirement 224, the motor controller transmits a voltage value requirement 222 to the intelligent battery pack 210 which fulfills this voltage value requirement 222 possibly by reconfiguring the series and parallel interconnection of the energy modules, so that the resulting terminal voltage 240, 242 of said battery pack is greater than but as close as possible to the voltage value requirement 222.

Figure 3:
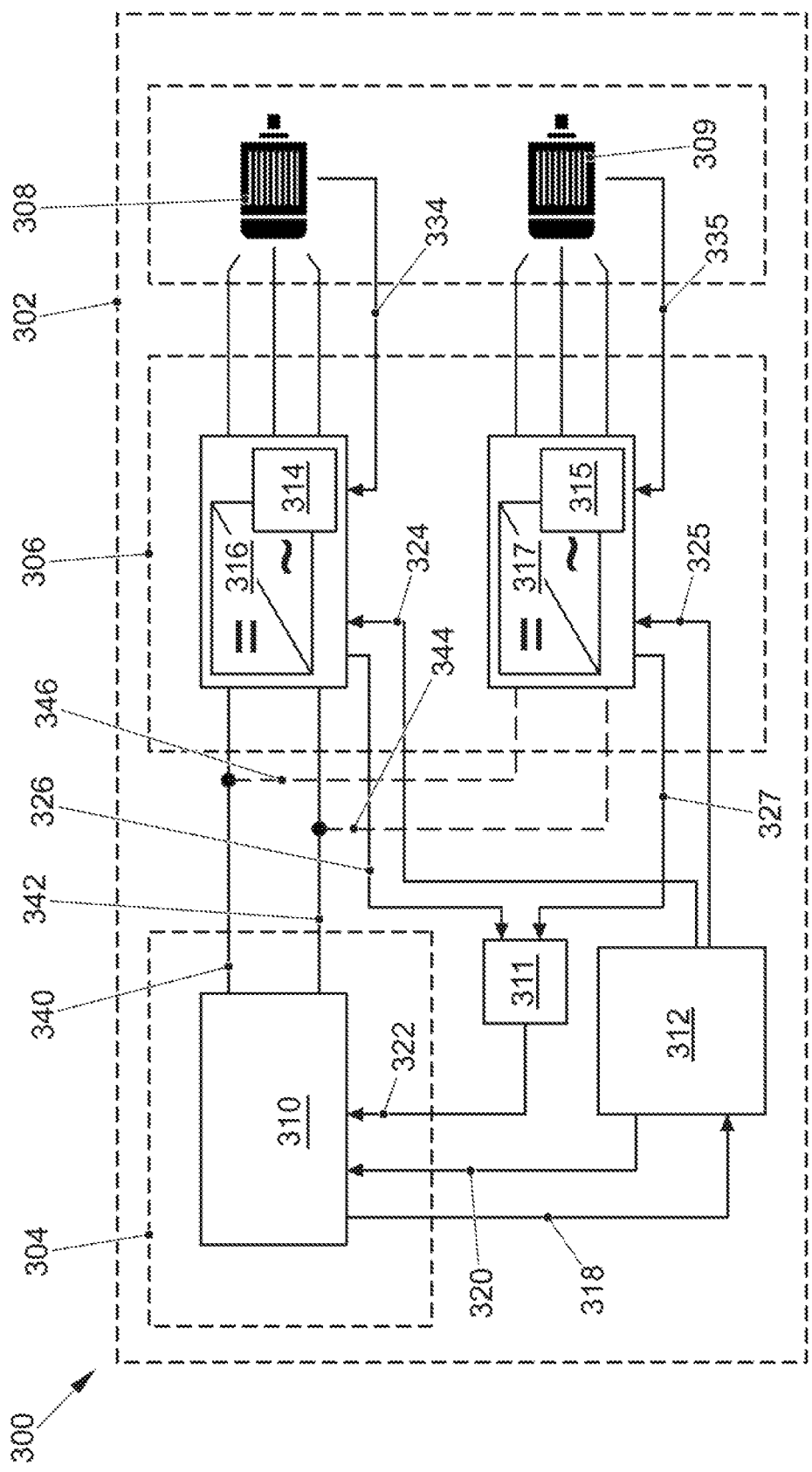
FIG. 3 shows a schematic illustration of one embodiment of the method according to aspects of the invention for a drive train in the case of a plurality of N-phase electrical machines.

FIG. 3 shows a schematic illustration 300 of one embodiment of the method according to aspects of the invention for a drive train 302 comprising DC voltage supply 304, AC voltage supply 306 having a plurality of inverters 316, 317, and a plurality of three-phase electrical machines 308, 309. The intelligent battery pack 310 provides a terminal voltage 340, 342, 344, 346 to the respective inputs of the inverters 316, 317. The respective three-phase inverter 316, 317 then supplies a three-phase current to the respective three-phase electrical machine 308, 309. A motor controller 314, 315 is arranged on each inverter 316, 317, said motor controller receiving in a transmitted manner a respective rotor position 334, 335 from the respective three-phase electrical machine 308, 309. A respective torque requirement 324, 325 is transmitted to the respective motor controller 314, 315 by the vehicle high-voltage control means 312. Depending on the torque requirement 324, 325, the respective motor controller transmits a respective voltage value requirement 326, 327 to a maximum value control unit which ascertains a maximum voltage value requirement 322 from amongst the voltage value requirements 326, 327 and passes it on to the intelligent battery pack 310. Said intelligent battery pack fulfills the voltage value requirement 322 possibly by reconfiguring the series and parallel interconnection of the energy modules, so that the resulting terminal voltage 340, 342 of said battery pack is greater than but as close as possible to the voltage value requirement 322. Further tasks of the vehicle high-voltage control means 312 include switching the intelligent battery pack 310 to an on or off state 320, and having knowledge 318 of the state of charge and the temperature of individual energy modules of the intelligent battery pack 310. The illustration 300 can be extended in the same way by further inverters and electrical machines.

What is claimed is:

1. A method for improving a modulation index using an intelligent battery pack including a plurality of freely and reconfigurably interconnectable energy modules and an energy module having at least one energy cell and at least two switches, said method comprising:

reconfiguring an interconnection of a respective energy module with at least one adjacent energy module of the battery pack from a series interconnection to a parallel interconnection using a controller, wherein the interconnection of the energy modules of the battery pack is formed by a battery controller which is comprised by said controller, adjusting a terminal voltage of the battery pack, which terminal voltage results from the respective interconnection, in accordance with a respectively prespecified load demand on at least one N-phase electrical machine, wherein the terminal voltage is connected as an input voltage to at least one at least two-stage inverter, forming an N-phase alternating current for supplying a respective N-phase electrical machine by the at least one at least two-stage inverter on a basis of a level of said input voltage, forming a respective load demand on the respective N-phase electrical machine by at least one motor controller of said controller, and transmitting the load demand on the respective N-phase electrical machine, which load demand is formed by the at least one motor controller, to the battery controller as a voltage value requirement.

2. The method as claimed in claim 1, in which the at least one at least two-stage inverter is selected as a two-stage inverter.

3. The method as claimed in claim 1, further comprising monitoring state values of the battery pack using a vehicle high-voltage control means.

4. The method as claimed in claim 3, further comprising selecting at least one of a temperature, a state of charge, and an on/off state as state values of the battery pack.

5. A method for improving a modulation index using an intelligent battery pack including a plurality of freely interconnectable energy modules and an energy module having at least one energy cell and at least two switches, said method comprising:

implementing a series or parallel interconnection of a respective energy module with at least one adjacent energy module of the battery pack using a controller, adjusting a terminal voltage of the battery pack, which terminal voltage results from the respective interconnection, in accordance with a respectively prespecified load demand on at least one N-phase electrical machine, wherein the terminal voltage is connected as an input voltage to at least one at least two-stage inverter, forming an N-phase alternating current for supplying a respective N-phase electrical machine by the at least one at least two-stage inverter on a basis of a level of said input voltage, forming a respective load demand on the respective N-phase electrical machine by at least one motor controller of said controller, and ascertaining a single load demand from the load demands on the respective N-phase electrical machines, which load demands are formed by at least two motor controllers, and is transmitted to the battery controller as voltage value requirement.

6. A method for improving a modulation index using an intelligent battery pack including a plurality of freely and reconfigurably interconnectable energy modules and an energy module having at least one energy cell and at least two switches, said method comprising:

reconfiguring an interconnection of a respective energy module with at least one adjacent energy module of the battery pack from a series interconnection to a parallel interconnection using a controller, wherein the interconnection of the energy modules of the battery pack is formed by a battery controller which is comprised by said controller, transmitting a terminal voltage value, which is implemented by the interconnection of the energy modules, to at least one motor controller by the battery controller, adjusting a terminal voltage of the battery pack, which terminal voltage results from the respective interconnection, in accordance with a respectively prespecified load demand on at least one N-phase electrical machine, wherein the terminal voltage is connected as an input voltage to at least one at least two-stage inverter, and forming an N-phase alternating current for supplying a respective N-phase electrical machine by the at least one at least two-stage inverter on a basis of a level of said input voltage.

7. A system for improving a modulation index using an intelligent battery pack, which system comprises:

a battery pack which has a plurality of energy modules each being reconfigurable to be interconnected in series with respective adjacent energy modules in a first configuration and interconnected in parallel with the respective adjacent energy modules in a second configuration, wherein each energy module has at least one energy cell and at least two switches, at least one at least two-stage inverter, at least one N-phase electrical machine, at least one control unit which is equipped with a computer processor and a computer program which runs on the computer processor, which control unit is configured to control a terminal voltage of the battery pack, which terminal voltage results from the reconfigurable interconnection of the energy modules, in accordance with a prespecified load demand on the respective N-phase electrical machine, wherein the control unit comprises a battery control unit and at least one motor control unit.

8. The system as claimed in claim 7, further comprising a vehicle high-voltage control device which is configured to record at least one of a temperature, a state of charge and an on/off state of the battery pack.

9. A system for improving a modulation index using an intelligent battery pack, which system comprises:

a battery pack which has a plurality of energy modules each being configured to be interconnected in series or in parallel with respective adjacent energy modules, wherein each energy module has at least one energy cell and at least two switches, at least one at least two-stage inverter, at least one N-phase electrical machine, at least one control unit which is equipped with a computer processor and a computer program which runs on the computer processor, which control unit is configured to control a terminal voltage of the battery pack, which terminal voltage results from an interconnection of the energy modules, in accordance with a prespecified load demand on the respective N-phase electrical machine, the at least one control unit further comprising a battery control unit and at least one motor control unit, and a maximum value control unit, wherein the maximum value control unit is configured to determine a maximum load demand from at least two load demands which are formed by a respective motor control unit and to transmit said maximum load demand to the battery control unit.

* * * * *